United States Patent [19]

West et al.

[11] Patent Number: 5,061,601
[45] Date of Patent: Oct. 29, 1991

[54] RADIATION-SENSITIVE COMPOSITION CONTAINING A VINYL PYRROLIDONE POLYMER AND USE THEREOF IN LITHOGRAPHIC PRINTING PLATES

[75] Inventors: Paul R. West, Fort Collins; James E. Mitchell, Windsor; Gary R. Miller, Fort Collins; Paul R. Josephson, Jr., Fort Collins; Raymond W. Ryan, Jr., Fort Collins, all of Colo.

[73] Assignee: Eastman Kodak Company, Rochester, N.Y.

[21] Appl. No.: 554,232

[22] Filed: Jul. 17, 1990

[51] Int. Cl.$^5$ ............................................. G03C 1/77
[52] U.S. Cl. .................................... 430/278; 430/285; 430/286; 430/302
[58] Field of Search ............... 430/302, 285, 278, 281, 430/286

[56] References Cited

U.S. PATENT DOCUMENTS

| | | |
|---|---|---|
| 3,677,755 | 7/1972 | Fukui et al. ........................ 430/278 |
| 3,929,489 | 12/1975 | Arcesi et al. . |
| 4,139,390 | 2/1979 | Rauner et al. . |
| 4,264,713 | 4/1981 | Shinozaki et al. ................... 430/281 |
| 4,272,611 | 6/1981 | Vyvial et al. ........................ 430/281 |
| 4,315,066 | 2/1982 | Lambert ............................... 430/271 |
| 4,419,437 | 12/1983 | Noonan et al. . |
| 4,425,424 | 1/1984 | Altland et al. . |
| 4,640,886 | 2/1987 | Miller et al. . |
| 4,865,951 | 9/1989 | Huddleston et al. ............... 430/278 |

OTHER PUBLICATIONS

"The Photoresist Story", M. Hepher, The Journal of Photographic Science, vol. 12, pp. 181-190, 1964.

Primary Examiner—Marion E. McCamish
Assistant Examiner—Christopher D. RoDee
Attorney, Agent, or Firm—Alfred P. Lorenzo

[57] ABSTRACT

Radiation-sensitive compositions which are especially useful in the production of negative-working lithographic printing plates comprise a photocrosslinkable polymer containing the photosensitive group

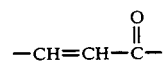

as an integral part of the polymer backbone and, in an amount sufficient to improve the properties of the composition, a polymer of vinyl pyrrolidone. The polymer of vinyl pyrrolidone improves the properties of the radiation-sensitive composition in regard to such factors as shelf life, image contrast, and developability and thereby provides a superior lithographic printing plate.

12 Claims, No Drawings

RADIATION-SENSITIVE COMPOSITION CONTAINING A VINYL PYRROLIDONE POLYMER AND USE THEREOF IN LITHOGRAPHIC PRINTING PLATES

FIELD OF THE INVENTION

This invention relates in general to radiation-sensitive compositions and in particular to radiation-sensitive compositions which contain a photocrosslinkable polymer. More specifically, this invention relates to novel radiation-sensitive compositions which are especially useful in the production of lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Negative-working lithographic printing plates are prepared from negative-working radiation-sensitive compositions that are formed from polymers which crosslink in radiation-exposed areas. A developing solution is used to remove the unexposed portions of the coating to thereby form a negative image.

The most widely used type of negative-working lithographic printing plate comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates utilizing a radiation-sensitive composition which includes a photocrosslinkable polymer containing the photosensitive group:

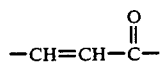

as an integral part of the polymer backbone. (See, for example, U.S. Pat. Nos. 3,030,208, 3,622,320, 3,702,765 and 3,929,489). A typical example of such a photocrosslinkable polymer is the polyester prepared from diethyl p-phenylenediacrylate and 1,4-bis(β-hydroxyethoxy)-cyclohexane, which is comprised of recurring units of the formula:

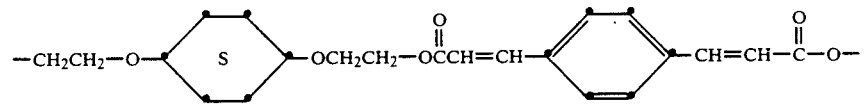

This polyester, referred to hereinafter as Polymer A, has been employed for many years in lithographic printing plates which have been extensively used on a commercial basis. These printing plates have typically employed an anodized aluminum substrate which has been formed by electrolytic anodization with an electrolyte comprised of phosphoric acid.

Polyesters in addition to Polymer A which are especially useful in the preparation of lithographic printing plates are those which incorporate ionic moieties derived from monomers such as dimethyl-3,3'-[(sodioimino)disulfonyl]dibenzoate and dimethyl-5-sodiosulfoisophthalate. Polyesters of this type are well known and are described, for example, in U.S. Pat. No. 3,929,489 issued Dec. 30, 1975. A preferred polyester of this type, referred to hereinafter as Polymer B, is poly[1,4-cyclohexylene-bis(oxyethylene)-p-phenylenediacrylate]-co-3,3'-[(sodioimino)disulfonyl]dibenzoate. Another preferred polyester of this type, referred to hereinafter as Polymer C, is poly[1,4-cyclohexylene-bis-(oxyethylene)-p-phenylenediacrylate]-co-3,3'-[(sodioimino)disulfonyl]dibenzoate-co-3-hydroxyisophthalate.

While lithographic printing plates prepared from photocrosslinkable polymers such as Polymer A, Polymer B or Polymer C have many advantageous properties, they suffer from certain deficiencies which have limited their commercial acceptance. Thus, for example, shelf-life can be inadequate in that significant scumming in the background areas tends to manifest itself upon aging of the plate without special treatments of the support. As described in Cunningham et al, U.S. Pat. No. 3,860,426, shelf-life is enhanced by overcoating the phosphoric-acid-anodized aluminum substrate with a subbing layer containing a salt of a heavy metal, such as zinc acetate, dispersed in a hydrophilic cellulosic material such as carboxymethylcellulose. As described in European Patent Application No. 0218160, published Apr. 15, 1987, shelf-life can also be enhanced by applying a silicate layer over the anodic layer and then subjecting the silicate layer to a passivating treatment with a salt of a heavy metal, such as zinc acetate.

Omitting the use of such overcoating or passivating treatment of the substrate results in an increasing amount of coating residue on the plate following development as the plate ages, i.e., shelf-life is inadequate. However, the presence of zinc or other heavy metals in the printing plate in extractable form is undesirable because of the potential of contaminating the developer to the point that it can no longer be legally discharged into municipal sewage systems. Moreover, even with zinc acetate passivation or the addition of zinc acetate to a cellulosic subbing layer, the presensitized printing plates exhibit a substantial increase in toe speed on aging which results in undesirably low contrast.

A further disadvantage of the aforesaid photopolymer coatings is that the quantity of coating which can be processed with a given quantity of aqueous developer is less than desirable due to the fact that the coating breaks-up as fairly large particles which tend to redeposit on the imaged areas of the printing plate. The photopolymer coatings can be caused to break-up into finer particles upon development by drying them at higher temperatures than normally used. The use of higher drying temperatures, however, increases manufacturing costs and decreases production efficiency. Furthermore, although the particle sizes are finer, the quantity of photopolymer coating which can be processed before redeposit begins to occur is still less than desirable.

Other disadvantages associated with the use of the aforesaid photopolymers in lithographic printing plates include a tendency for undesirable mottle formation to occur and the need to use an undesirably high concentration of organic solvent in an aqueous-based developing composition. Mottle is particularly affected by the mechanics of film drying, determined by such factors as solvent evaporation rates.

Blinding problems are commonly encountered with commercially available aqueous-developable lithographic printing plates, so that there is an acute need in the art for an additive that is capable of improving ink receptivity.

It is known to incorporate non-light-sensitive, film-forming, resins in radiation-sensitive compositions of the type described hereinabove. For example, U.S. Pat. No. 3,929,489 refers to the use of phenolic resins, epoxy resins, hydrogenated rosin, poly(vinyl acetals), acrylic polymers, poly(alkylene oxides), and poly(vinyl alcohol) and U.S. Pat. No. 4,425,424 specifically discloses the use of polystyrene resin. These resins are employed for such purposes as controlling wear resistance of the coating, improving resistance to etchants and increasing the thickness of the radiation-sensitive layer so as to ensure complete coverage of the relatively rough metal substrate and thereby prevent blinding. However, these resins do not impart beneficial properties with respect to shelf-life or processing characteristics.

It is toward the objective of providing an improved radiation-sensitive composition, useful in the production of lithographic printing plates, that overcomes one or more of the disadvantages described above that the present invention is directed.

SUMMARY OF THE INVENTION

In accordance with this invention, a polymer of vinyl pyrrolidone is incorporated in a radiation-sensitive composition which includes a photocrosslinkable polymer containing the photosensitive group.

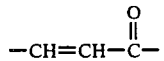

as an integral part of the polymer backbone. The polymer of vinyl pyrrolidone improves the properties of the radiation-sensitive composition in regard to such factors as shelf-life, image contrast, and developability and thereby provides a superior negative-working lithographic printing plate.

The polymer of vinyl pyrrolidone employed in this invention can be a homopolymer of vinyl pyrrolidone or a copolymer of vinyl pyrrolidone with an ethylenically-unsaturated copolymerizable monomer such as vinyl acetate.

DESCRIPTION OF THE PREFERRED EMBODIMENTS

The following copending commonly assigned U.S. Patent Applications are directed to inventions which are closely related to that described herein:

(1) U.S. patent application Ser. No. 554,239, filed July 17, 1990, "Radiation-Sensitive Composition Containing a Poly(N-Acyl-Alkyleneimine) and Use Thereof in Lithographic Printing Plates" by Paul R. West et al.

(2) U.S. patent application Ser. No. 554,231, filed July 17, 1990, "Radiation-Sensitive Composition Containing An Unsaturated Polyester and Use Thereof in Lithographic Printing Plates" by Paul R. West et al.

(3) U.S. patent application Ser. No. 554,230, filed July 17, 1990, "Radiation-Sensitive Composition Containing Both a Vinyl Pyrrolidone Polymer and An Unsaturated Polyester and Use Thereof in Lithographic Printing Plates" by Paul R. West et al. and (4) U.S. patent application Ser. No. 554,229, filed July 17, 1990, "Radiation-Sensitive Composition Containing Both a Poly(N-Acyl-Alkyleneimine) and An Unsaturated Polyester and Use Thereof in Lithographic Printing Plates" by Paul R. West et al.

As indicated hereinabove, the radiation-sensitive compositions of this invention contain a polymer of vinyl pyrrolidone, including homopolymers and copolymers with ethylenically unsaturated copolymerizable monomers. Preferably, the copolymer is one which contains at least 50 mole percent of vinyl pyrrolidone.

The homopolymer of vinyl pyrrolidone, i.e., poly(N-vinyl-2-pyrrolidone) is represented by the formula:

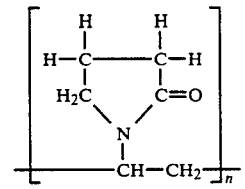

wherein n represents a whole number, e.g., a number sufficiently high to provide a molecular weight of from several hundred to several hundred thousand. These polymers are well known and can be prepared, for example, by processes of polymerization of N-vinyl-2-pyrrolidone, disclosed in U.S. Pat. No. 2,265,540, issued Dec. 9, 1941 and U.S. Pat. No. 2,335,454, issued Nov. 30, 1943.

Ethylenically unsaturated monomers copolymerizable with vinyl pyrrolidone include:
vinyl acetate
vinyl propionate
vinyl chloride
styrene
methylacrylate
methylmethacrylate
ethylacrylate
n-propylacrylate
ethylmethacrylate
butylacrylate
butylmethacrylate
methylacrylamide
methylmethacrylamide
N-acryloylmorpholine
N-acryloylpiperidine
vinylpyridine and the like.

Two or more of such polymerizable monomers can, if desired, be interpolymerized with vinyl pyrrolidone.

Examples of copolymers of vinyl pyrrolidone particularly useful in combination with or as an alternative to poly(N-vinyl-2-pyrrolidone) in the present invention include: copoly(vinylacetate/N-vinyl-2-pyrrolidone) copoly(N-acryloylmorpholine/N-vinyl-2-pyrrolidone) copoly(N-acryloylpiperidine/N-vinyl-2-pyrrolidone) copoly(methylacrylate/N-vinyl-2-pyrrolidone) copoly(styrene/N-vinyl-2-pyrrolidone) copoly(ethyl methacrylate/N-vinyl-2-pyrrolidone) copoly(4-vinylpyridine/N-vinyl-2-pyrrolidone) and the like.

The polymer of vinyl pyrrolidone is typically incorporated in the radiation-sensitive composition in an amount of from about 2 to about 30 percent by weight based on total polymer content, and more particularly in an amount of from about 5 to about 15 percent by weight.

The radiation-sensitive compositions of this invention comprise photocrosslinkable polymers, such as polyesters, containing the photosensitive group

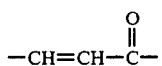

as an integral part of the polymer backbone. For example, preferred photocrosslinkable polymers are polyesters prepared from one or more compounds represented by the following formulae:

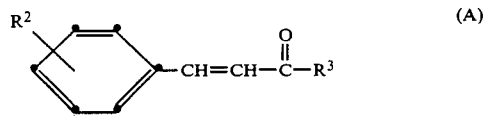

where $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference.

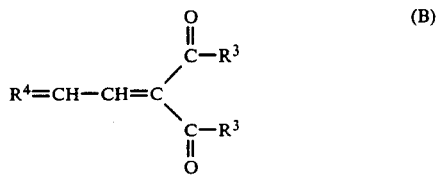

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidene malonic acid, naphthylallylidenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

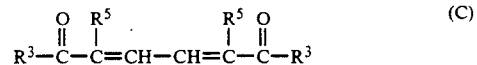

$R^3$ is as defined above; and $R^5$ is hydrogen or methyl. Particularly useful compounds of formula (C) are trans, trans-muconic acid, cis-transmuconic acid, cis, cis-muconic acid, α,α'-cis, trans-dimethylmuconic acid, α,α'-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

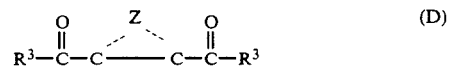

$R^3$ is as defined above; and Z represents the atoms necessary to form an unsaturated bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Patent No. 824,096 (issued Sept. 30, 1969 to Mench et al), the disclosure of which is incorporated herein by reference.

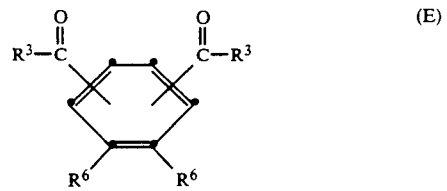

$R^3$ is as defined above; and $R^6$ is hydrogen, alkyl 1 to 12 carbon atoms, cycloalkyl of 5 to 12 carbon atoms or aryl of 6 to 12 carbon atoms. $R^6$ can be substituted where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexadiene-1,4-dicarboxylic acid, 1,5-cyclohexadiene-1,4-dicarboxylic acid and functional equivalents thereof. These and other useful compounds are described in Belgian Patent No. 754,892 (issued Oct. 15, 1970), the disclosure of which is incorporated herein by reference.

Preferred photocrosslinkable polyesters for use in this invention are p-phenylene diacrylate polyesters.

Printing plates of this invention comprise a support having coated thereon a layer containing the radiation-sensitive composition described above. Such plates can be prepared by forming coatings with the coating composition and removing the solvent by drying at ambient or elevated temperatures. Any one of a variety of conventional coating techniques can be employed, such as extrusion coating, doctor-blade coating, spray coating, dip coating, whirl coating, spin coating, roller coating, etc.

Coating compositions containing the mixture of polymers of this invention can be prepared by dispersing or dissolving the polymers in any suitable solvent or combination of solvents used in the art to prepare polymer dopes. The solvents are chosen to be substantially unreactive toward the polymers within the time period contemplated for maintaining the solvent and polymer in association and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers, such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber based materials such as paper, polyethylene-coated paper, polypropylene-coated paper, parchment, cloth, etc.; sheets and foils of such materials as aluminum, copper, magnesium zinc, etc.; glass and glass coated with such metals as chromium alloys, steel, silver, gold, platinum, etc.; synthetic resin and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized. Particularly preferred support materials are described in Miller et al, U.S. Pat. No. 4,647,346, issued Mar. 3, 1987, and Huddleston et al, U.S. Pat. No. 4,865,951, issued Sept. 12, 1989.

The support can be preliminarily coated—i.e., before receipt of the radiation-sensitive coating - with known subbing layers such as copolymers of vinylidene chloride and acrylic monomers - e.g., acrylonitrile, methyl acrylate, etc. and unsaturated dicarboxylic acids such as itaconic acid, etc.; carboxymethyl cellulose, gelatin; polyacrylamide; and similar polymer materials. A preferred subbing composition comprises benzoic acid and is described in Miller et al, U.S. Pat. No. 4,640,886, issued Feb. 3, 1987.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

The printing plate of this invention can be exposed by conventional methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps, fluorescent lamps, tungsten filament lamps, "photoflood" lamps, lasers and the like. The exposure can be by contact printing techniques, by lens projection, by reflex, by bireflex, from an image-bearing original or by any other known technique.

The exposed printing plate of this invention can be developed by flushing, soaking, swabbing or otherwise treating the radiation-sensitive composition with a solution (hereinafter referred to as a developer) which selectively solubilizes (i.e., removes) the unexposed areas of the radiation-sensitive layer. The developer is preferably an aqueous solution having a pH as near to neutral as is feasible.

In a preferred form, the developer includes a combination of water and an alcohol that is miscible with water, or able to be rendered miscible by the use of cosolvents or surfactants, as a solvent system. The proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the crosslinked radiation-sensitive layer during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e., dihydroxy poly(alkylene oxides)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

A preferred developing composition for use with the novel lithographic printing plates of this invention is an aqueous composition including:

(a) a nontoxic developing vehicle, such as butyrolactone, phenoxy propanol, phenoxy ethanol, benzyl alcohol or methyl pyrrolidone, which is a non-solvent for any of the components of the lithographic plate;

(b) a first surfactant comprising a sodium, lithium or potassium salt of xylene sulfonic acid;

(c) a second surfactant comprising a sodium, lithium or potassium salt of toluene, ethyl benzene, cumene or mesitylene sulfonic acid;

(d) a third surfactant comprising a sodium, lithium or potassium salt of an alkyl benzene sulfonic acid, the alkyl group containing at least ten carbon atoms, or an alkyl naphthalene sulfonic acid, the alkyl group containing from one to four carbon atoms;

(e) a cold water soluble film-forming agent such as polyvinyl pyrrolidone, polystyrene/maleic anhydride copolymers, polyvinyl alcohol, polyvinyl methyl ethers and polystyrene/vinyl acetate copolymers;

(f) an alkanolamine desensitizing agent such as diethanolamine;

and (g) an acid, such as citric, ascorbic, tartaric, glutaric, acetic, phosphoric, sulfuric or hydrochloric acid, to control the pH of the developing composition.

These developing compositions are described in copending commonly assigned U.S. patent application Ser. No. 379,823, filed July 14, 1989, "Aqueous Developer Composition For Developing Negative-Working Lithographic Printing Plates", by J. E. Walls, the disclosure of which is incorporated herein by reference. A developing composition of this type is commercially available from Eastman Kodak Company, Rochester, New York, as KODAK AQUEOUS PLATE DEVELOPER MX-1469-1.

After development, the printing plate can be treated in any known manner consistent with its intended use. For example, lithographic printing plates are typically subjected to desensitizing etches.

In addition to the photocrosslinkable polymer and the vinyl pyrrolidone polymer, a number of other addenda can be present in the coating composition and ultimately form a part of the completed printing plate. For example, radiation sensitivity of the radiation-sensitive polymeric composition can be enhanced by incorporating therein one or more spectral sensitizers. Suitable spectral sensitizers include anthrones, nitro sensitizers, triphenylmethanes, quinones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the compositions in effective sensitizing amounts easily determined by one of the ordinary skill in the art.

The coating composition can contain pigments preferably having a maximum average particle size less than about 3 micrometers. These pigments can provide a visible coloration to an image before or after development of the element. Useful pigments are well known in the art and include titanium dioxide, zinc oxide, copper phthalocyanines, halogenated copper phthalocyanines, quinacridine, and colorants such as those sold commercially under such trade names as Monastral Blue and Monastral Red B. The pigments are generally present in the compositions in an amount within the range of from 0 to about 50 percent (by weight) based on the total dry composition weight. Preferred amounts are within the range of from about 5 to about 20 percent (by weight).

It is frequently desirable to add print out or indicator dyes to the compositions to provide a colored print out image after exposure. Useful dyes for such purpose include monoazo, diazo, methine, anthraquinone, triarylmethane, thiazine, xanthene, phthalocyanine, azine, cyanine and leuco dyes as described, for example, in U.S. Pat. Nos. 3,929,489 and 4,139,390 and references noted therein. Such dyes are present in amounts readily determined by a person of ordinary skill in the art.

It is recognized that the radiation-sensitive composition of this invention can become crosslinked prior to intended exposure if the compositions or printing plates of this invention are stored at elevated temperatures, in areas permitting exposure to some quantity of actinic radiation and/or for extended periods of time. To insure against crosslinking the composition inadvertently before intended exposure to actinic radiation, stabilizers can be incorporated into the radiation-sensitive compositions and printing plates of this invention. Useful stabilizers include picoline N-oxide; phenols, such as 2,6-di-tert-butyl-p-cresol, 2,6-di-tert-butylanisole and p-methoxyphenol; hydroquinones such as hydroquinone, phloroglucinol and 2,5-di-tert-butylhydroquinone; triphenylmetallics, such as triphenylarsine; triphenylstilbene; and tertiary amines, such as N-methyldiphenylamine.

Still other addenda useful in the printing plates of this invention include antioxidants, surfactants, anti-scumming agents, and others known in the art.

Binders or extenders can optionally be incorporated into the radiation-sensitive composition. Such binders or extenders can be present in an amount within the range of from 0 to about 50 percent (by weight) based on total dry composition weight. Suitable binders include styrene-butadiene copolymers; silicone resins; styrene-alkyd resins; silicone-alkyd resins; soya-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-co-alkaryloxy-alkylene terephthalate); phenolformaldehyde resins; ketone resins; polyamides; polycarbonates; polythiocarbonates, poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin. Methods of making binders or extenders of this type are well known in the prior art. A typical resin of the type contemplated for use is Piccolastic A50 TM, commercially available from Hercules, Inc., Wilmington, Del. Other types of binders which can be used include such materials as paraffin and mineral waxes.

The invention is further illustrated by the following examples of its practice.

EXAMPLE 1

Coating compositions useful in preparing lithographic printing plates were prepared in accordance with the following formulations:

| Component | Amounts (grams) | | |
|---|---|---|---|
| | Composition 1 | Composition 2 | Composition 3 |
| (1) Polymer A (15% by weight solution in 1,2-dichloroethane) | 144.16 | | |
| (2) Polymer B (15% by weight solution in 1,2-dichloroethane) | | 144.15 | |
| (3) Polymer C (15% by weight solution in 1,2-dichloroethane) | | | 144.15 |
| (4) MONASTRAL Red pigment (7% by weight dispersion in 1,2-dichloroethane) | 52.13 | 51.54 | |
| (5) MONASTRAL Blue pigment (7% by weight dispersion in 1,2-dichloroethane) | | | 18.49 |

-continued

| Component | Amounts (grams) | | |
|---|---|---|---|
| | Composition 1 | Composition 2 | Composition 3 |
| (6) 2-[Bis(2-furoyl)methylene]-1-methyl-naphtho[1,2-d]thiazoline | 0.63 | | 0.83 |
| (7) 3,3'-Carbonylbis(5,7-di-n-propoxycoumarin) | | 1.03 | |
| (8) 2,6-Di-t-butyl-p-cresol | 0.60 | 0.68 | 0.60 |
| (9) N-(4-Chlorobenzenesulfonyloxy)-1,8-naphthalimide | 1.77 | 1.14 | 1.42 |
| (10) Dihydroanhydropiperidinohexose reductone | 0.08 | 0.02 | 0.03 |
| (11) Leuco propyl violet | 0.46 | 0.28 | 0.27 |
| (12) MODAFLOW coating aid* | 0.02 | | |
| (13) FC-430 surfactant** | | 0.15 | 0.23 |
| (14) 1,2-Dichloroethane | 597.06 | 597.06 | 630.90 |

*MODAFLOW coating aid is a copolymer of ethyl acrylate and 2-ethylhexyl acrylate manufactured by Monsanto Corporation.
**FC-430 surfactant is a mixture of fluoroaliphatic polymeric esters manufactured by Minnesota Mining and Manufacturing Company.

In the above formulations, (1), (2) and (3) serve as film-forming polymers, (4) and (5) serve as colorants, (6) and (7) serve as spectral sensitizers, (8) serves as a stabilizer, (9) serves as a photooxidant, (10) serves as an antioxidant, (11) serves as a print-out dye, (12) and (13) serve as coating aids, and (14) serves as a solvent.

A control coating was prepared by incorporating polystyrene resin (available under the trademark Piccolastic A-50 from Hercules, Inc.) in Composition 1 in an amount of 15.3% of the total polymer content. Compositions within the scope of the present invention were prepared by incorporating copoly[vinylacetate (40)/N-vinyl-2-pyrrolidone (60)], which is available under the trademark S-630 from GAF Corporation, in Composition 1 in amounts of 3.8, 7.7, 11.5, and 15.3% of the total polymer content.

Each composition was used to prepare a lithographic printing plate by coating it over a phosphoric-acid-anodized aluminum substrate provided with a thin carboxymethyl cellulose subcoat. All coatings were baked for 2 minutes at 100° C. as an accelerated aging test. All of the coatings that contained the S-630 resin could be imaged and developed cleanly after the bake treatment, while the comparison coating that contained the polystyrene resin left a heavy coating residue on the substrate under the same conditions. These results demonstrate the ability of a vinyl pyrrolidone polymer to improve the shelf-life of the radiation-sensitive photopolymer coating without having to resort to the use of treatments with heavy metal salts such as zinc acetate. Similar results were obtained using 7.7% of poly(N-vinyl-2-pyrrolidone) in place of the S-630 resin in Composition 1. Similar results were also obtained using 7.7% of poly(N-vinyl-2-pyrrolidone) in each of Compositions 2 and 3.

EXAMPLES 2-5

Incubation tests were carried out to determine the effectiveness of vinyl pyrrolidone polymers in providing and maintaining high contrast. In carrying out these tests, printing plates were prepared by coating Composition 1 described in Example 1, containing additives as indicated below, onto phosphoric-acid-anodized aluminum in an amount sufficient to provide a photopolymer coverage of 810 milligrams per square meter. The contrast of each coating was determined from its sensitometric response immediately after coating and again after incubation for two weeks at 50° C. Control A had a thin subcoat of carboxymethyl cellulose which contained zinc acetate in order to stabilize the photosensitive coating sufficiently to be able to measure the speed response after incubation. Control B and Examples 2 to 5 also had a thin subcoat of carboxymethyl cellulose but the subcoat did not contain any zinc acetate. All coatings were processed with KODAK AQUEOUS PLATE DEVELOPER MX-1469-1, available from Eastman Kodak Company, Rochester, N.Y. The results obtained are described in Table I below.

TABLE I

| Test No. | Additive | Coating Weight (mg/m$^2$) | Fresh Contrast | Incubated Contrast |
|---|---|---|---|---|
| Control Test A | Polystyrene | 146 | 1.6 | 0.71 |
| Control Test B | Polystyrene | 146 | 1.6 | * |
| Example 2 | Polyvinylpyrrolidone** | 73 | 1.2 | 1.5 |
| Example 3 | Copolymer of vinyl pyrrolidone (60%) and vinyl acetate (40%) | 73 | 1.2 | 1.2 |
| Example 4 | Copolymer of vinyl pyrrolidone (60%) and vinyl acetate (40%) | 146 | 1.36 | 1.2 |
| Example 5 | Polyvinylpyrrolidone/ polystyrene | 73/110 | 1.6 | 1.3 |

*This coating failed the incubation test so that a contrast reading could not by made.
**Molecular weight of approximately 40,000.

As indicated by the data in Table I, coatings in which polystyrene was utilized as the additive, namely Control Test A and Control Test B, were not able to maintain high contrast values. In Control Test A, which utilized zinc acetate in the subbing layer, the contrast dropped from 1.6 to 0.71, i.e., it dropped to less than half its original value. Control Test B, which also employed polystyrene and did not utilize zinc acetate, failed the incubation test, i.e., unexposed areas of the plate could not be developed cleanly and left coating residues. On the other hand, Examples 2 to 5, each of which utilized a polymer of vinyl pyrrolidone, experienced a drop in contrast of no more than twenty percent and maintained the contrast level above one.

Homopolymers of vinyl pyrrolidone and copolymers containing at least 50 mole percent of vinyl pyrrolidone are both solvent soluble and water soluble. These solubility characteristics render them especially advantageous for use in the present invention since they facilitate both coating from solvent solution to form the radiation-sensitive layer and subsequent development by the use of "aqueous" developing solutions, i.e., developing solutions which are predominantly water but do contain small amounts of organic solvent. Incorporation of the polymer of vinyl pyrrolidone in the radiation-sensitive composition permits the use of lower concentrations of organic solvent in the aqueous developing solution, as compared with an otherwise identical composition that does not contain the polymer of vinyl pyrrolidone.

Current trends in the lithographic printing plate industry favor the use of "aqueous developers." By this is meant that the developer used to process the printing plate, either by hand or by machine, contains little or no organic solvent and that any organic solvent which is present is nontoxic and a high boiling material with a very low vapor pressure. Other ingredients included in the developer, such as salts and surfactants, are nontoxic and biodegradable. The present invention is especially well adapted, by virtue of the polymeric materials incorporated in the radiation-sensitive composition, for use with such "aqueous developers."

The invention has been described in detail with particular reference to preferred embodiments thereof, but it will be understood that variations and modifications can be effected within the spirit and scope of the invention.

We claim:

1. A negative-working lithographic printing plate comprising a support having thereon a radiation-sensitive layer of a composition comprising a mixture of (A) a photocrosslinkable polymer containing the photosensitive group

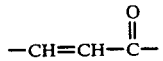

as an integral part of the polymer backbone and (B) a polymer of vinyl pyrrolidone.

2. A negative-working lithographic printing plate as claimed in claim 1, wherein said support is an anodized aluminum support.

3. A negative-working lithographic printing plate as claimed in claim 2, including a subbing layer between said anodized aluminum support and said radiation-sensitive layer.

4. A negative-working lithographic printing plate as claimed in claim 2, wherein said polymer of vinyl pyrrolidone is a homopolymer of vinyl pyrrolidone.

5. A negative-working lithographic printing late as claimed in claim 2, wherein said polymer of vinyl pyrrolidone is a copolymer of vinyl pyrrolidone with an ethylenically unsaturated copolymerizable monomer in which said copolymer contains at least 50 mole percent of vinyl pyrrolidone.

6. A negative-working lithographic printing plate as claimed in claim 5, wherein said ethylenically unsaturated copolymerizable monomer is vinyl acetate.

7. A negative-working lithographic printing plate as claimed in claim 2, wherein said polymer of vinyl pyrrolidone is present in said radiation-sensitive layer in an amount of from about 2 to about 30 percent by weight based on total polymer content.

8. A negative-working lithographic printing plate as claimed in claim 2, wherein said polymer of vinyl pyrrolidone is present in said radiation-sensitive layer in an amount of from about 5 to about 15 percent by weight based on total polymer content.

9. A negative-working lithographic printing plate as claimed in claim 2, wherein said photocrosslinkable polymer is a p-phenylene diacrylate ester.

10. A negative-working lithographic printing plate comprising an anodized aluminum support having thereon a radiation-sensitive layer of a composition comprising a mixture of (A) a photocrosslinkable polymer comprised of recurring units of the formula:

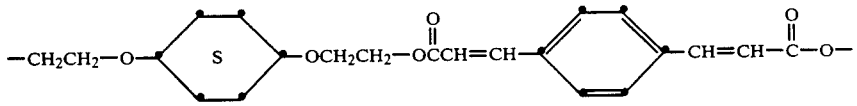

and (B) poly(N-vinyl-2-pyrrolidone).

11. A negative-working lithographic printing plate comprising an anodized aluminum support having thereon a radiation-sensitive layer of a composition comprising a mixture of (A) poly[1,4-cyclohexylene-bis(oxyethylene)-p-phenylene-diacrylate]-co-3,3'-[sodioimino)disulfonyl]dibenzoate. and (B) poly(N-vinyl-2-pyrrolidone).

12. A negative-working lithographic printing plate comprising an anodized aluminum support having thereon a radiation-sensitive layer of a composition comprising a mixture of (A) poly[1,4-cyclohexylene-bis(oxyethylene)-p-phenylene-diacrylate]-co-3,3'-[(sodioimino)disulfonyl]dibenzoate-co-3-hydroxyisophthalate and (B) poly(N-vinyl-2-pyrrolidone).

* * * * *